(12) United States Patent
Nakaya et al.

(10) Patent No.: US 7,110,307 B2
(45) Date of Patent: Sep. 19, 2006

(54) SEMICONDUCTOR MEMORY WITH A DATA HOLDING CIRCUIT HAVING TWO OUTPUT TERMINALS

(75) Inventors: Shuji Nakaya, Kobe (JP); Mitsuaki Hayashi, Kyoto (JP); Masakazu Kurata, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/025,138

(22) Filed: Dec. 30, 2004

(65) Prior Publication Data

US 2006/0002212 A1 Jan. 5, 2006

(30) Foreign Application Priority Data

Jan. 7, 2004 (JP) ............... 2004-002185

(51) Int. Cl.
*G11C 11/34* (2006.01)
(52) U.S. Cl. .................... 365/189.05; 365/94
(58) Field of Classification Search ........... 365/189.05, 365/94
See application file for complete search history.

(56) References Cited

U.S. PATENT DOCUMENTS

| | | | |
|---|---|---|---|
| 6,798,698 B1* | 9/2004 | Tanaka et al. | 365/185.22 |
| 2003/0035316 A1* | 2/2003 | Tanaka et al. | 365/185.03 |
| 2003/0147286 A1* | 8/2003 | Tanaka et al. | 365/185.17 |

FOREIGN PATENT DOCUMENTS

| | | |
|---|---|---|
| JP | 61255035 | 11/1986 |
| JP | 04034799 | 2/1992 |
| JP | 06176592 | 6/1994 |

* cited by examiner

*Primary Examiner*—Michael Tran
(74) *Attorney, Agent, or Firm*—Stevens, Davis, Miller & Mosher, LLP

(57) ABSTRACT

An output end and an inverted output end of a latch circuit that is connected to an output buffer circuit are switched with each other, and thereby, the relationship between the data of "0" or "1" and the drain of a memory cell is connected or not connected to a bit line is changed. In addition, an input of a sense amplifier is fixed at the grounding potential by means of a test control signal, and thereby, positive logic is confirmed in the case where the output of the output buffer circuit is "L," and negative logic is confirmed in the case where the output of the output buffer circuit is "H."

9 Claims, 10 Drawing Sheets

SEMICONDUCTOR MEMORY WITH A DATA HOLDING CIRCUIT HAVING TWO OUTPUT TERMINALS

BACKGROUND OF THE INVENTION

1. Field of the Invention

The present invention relates to a semiconductor device with a mask ROM (mask programmable ROM) which is programmable by means of a mask.

2. Prior Art

Patent Document 1, for example, discloses a conventional semiconductor device. Paragraphs 0002 to 0006 on page 2 and FIG. 2 of this document disclose the configuration of a contact programming mask ROM.

FIG. 9 is a circuit diagram showing the configuration of the above described contact programming mask ROM. In a contact programming ROM, whether or not the drain of a memory cell transistor is connected to a bit line respectively corresponds to "0" or "1" of memory data. Such a mask ROM is programmable by means of a mask.

A conventional semiconductor device is, as shown in FIG. 9, formed of a memory cell array 1, a column decoder 2, a sense amplifier 3, a transistor for charging 4, an output buffer circuit 6 and a latch circuit 15.

Memory cell array 1 has a configuration wherein a number of memory cells Mij (i=1 to m, and j=1 to n) made of N type MOS transistors are arranged in matrix form. The gates of memory cells Mij having the same number of i, that is to say, the memory cells aligned in the same row, are connected to the same word line selection signal WLi (i=1 to m). In addition, the sources of these memory cells Mij are connected to a wire at the grounding potential. These drains are connected to bit lines BLj (j=1 to n) in the case where the memory data of the memory cells is "0," and are made in the floating condition in the case where the memory data of the memory cells is "1."

Column decoder 2 is formed of N type MOS transistors Cj (j=1 to n). The drains of N type MOS transistors Cj (j=1 to n) are connected to each other, the sources are connected to bit lines BLj (j=1 to n), and the gates are connected to column selection signals CLj (j=1 to n), respectively.

Sense amplifier 3 is formed of a buffer circuit. The input thereof is connected to the drains of N type MOS transistors Cj (j=1 to n) that form column decoder 2, and the output is connected to an input end D of latch circuit 15.

Transistor for pre-charging 4 is formed of a P type MOS transistor. The gate of transistor for pre-charging 4 is connected to a charge control signal PCLK, the source is connected to a power supply terminal having a power supply potential, and the drain is connected to the drains of N type MOS transistors Cj (j=1 to n) that form column decoder 2.

The input of output buffer circuit 6 is connected to an output end Q of latch circuit 15, and the output is connected to an output end OUT.

The input terminal of latch circuit 15 is connected to the output end of sense amplifier 3, so that a signal of the same logic as the signal of input end D is outputted to output end Q when a latch control signal LCLK is "L" and a latch control signal NLCLK is "H." In addition, the output condition of output end Q is maintained when latch control signal LCLK is "H" and latch control signal NLCLK is "L."

The operation of reading data in memory cell M11, for example, in the semiconductor device that is formed as described above is described in reference to the timing chart of FIG. 10.

Column selection signal CL1 from among column selection signals CLj (j=1 to n) is set at the "H" level, and column selection signals CL2 to CLn are set at the "L" level. As a result of this, N type MOS transistor C1 from among N type MOS transistor Cj (j=1 to n) that form column decoder 2 is set at the ON condition, and the other N type MOS transistors C2 to Cn are set at the OFF condition.

Next, pre-charge control signal PCLK is set at the "L" level during a certain period of time Tp, so that transistor for pre-charging 4 is set to the ON condition for this period of time Tp. As a result of this, bit line BL1 is charged to the "H" level.

After bit line BL1 has been set at the "H" level, word line selection signal WL1 from among word line selection signals WLi (i=1 to m) is switched from the "L" level to the "H" level, and the other word line selection signals WL2 to WLm are maintained at the "L" level.

As a result of this, in the case where the drain of memory cell M11 is connected to bit line BL1, the charge that has charged bit line BL1 is discharged by memory cell M11 so that bit line BL1 becomes of the "L" level and the input of sense amplifier 3 becomes of the "L" level. In addition, as for latch control signals LCLK and NLCLK of latch circuit 15, when a word line from among word line selection signals WLi (i=1 to m) is selected, latch control signal LCLK is at the "L" level and latch control signal NLCLK is at the "H" level. Accordingly, the output of sense amplifier 3 becomes of the "L" level and output Q of latch circuit 15 becomes of the "L" level, so that "L" is read out from output end OUT of output buffer circuit 6 (shown by broken lines in FIG. 10).

In addition, in the case where the drain of memory cell M11 is not connected to bit line BL1, the charge that has charged bit line BL1 is not discharged by memory cell 11, so that bit line BL1 maintains the "H" level and the input of sense amplifier 3 also becomes of the "H" level. In addition, as for latch control signals LCLK and NLCLK of latch circuit 15, when a word line from among word line selection signals WLi (i=1 to m) is selected, latch control signal LCK is at the "L" level and latch control signal NLCLK is at the "H" level. Accordingly, the output of sense amplifier 3 becomes of the "H" level and output Q of latch circuit 15 becomes of the "H" level, so that "H" is read out from output end OUT of output buffer circuit 6 (shown by solid lines in FIG. 10).

Patent Document 1: Japanese Unexamined Patent Publication H6 (1994)-176592 (page 2, FIG. 2)

Patent Document 2: Japanese Unexamined Patent Publication S61 (1986)-255035 (pages 1 and 2, FIG. 2)

Patent Document 3: Japanese Unexamined Patent Publication H4 (1992)-34799 (pages 1 and 2, FIG. 3)

Conventional semiconductor devices have the following problems. The relationship between memory data "0" or "1," and whether or not the drain of a memory cell transistor is connected to a bit line, is fixed. As a result of this, in the case where there are a large number of "0" in the memory data, there are a large number of connections between the drains of memory cell transistors and bit lines.

In recent years, the number of steps for wiring between the drains of memory cell transistors and bit lines, as well as the number of steps for creating via holes, have increased in the structure of memory cells due to an increase in the number of layers for wiring which are to be processed during a short TAT (turn-around time). Furthermore, it becomes easy for the problem of poor connection to occur in the steps for wiring and in the steps for creating via holes for the connection between the drains of memory cell transistors and bit lines, due to miniaturization of the processed object.

As a result of this, the yield is lowered when there are a large number of connections between the drains of memory cell transistors and bit lines.

Therefore, a method for reducing the number of connections between the drains of memory cell transistors and bit lines by adding a circuit for inverting the data behind the sense amplifier of the mask ROM so as to change the logic of the connections of memory cell transistors to bit lines and the memory data has been proposed.

However, a problem arises where a control circuit must be added. In addition, there is a problem where it is difficult to control information at the time of analysis, whether or not the drains of memory cell transistors are connected to bit lines for data "0," because the logic differs, depending on the mask ROM mounted on the semiconductor device, and depending also on the respective outputs. In addition, in the case where the IP (intellectual property) of the mask ROM of which the logic can be changed is not available, a problem arises where the number of connections between the drains of memory cell transistors and bit lines cannot be reduced.

SUMMARY OF THE INVENTION

The present invention is provided in order to solve the above described problems with the prior art, and an object thereof is to provide a semiconductor device which makes it possible to change the logic while restricting the increase in the number of circuits, in a manner where the drains of memory cell transistors of which the number is smaller than the those that indicate memory data "0" or "1" are connected to bit lines, thereby preventing the yield from decreasing, by reducing the number of connections between the drains of memory cell transistors and bit lines.

Another object of the invention is to provide a semiconductor device which makes easy confirmation possible as to whether data of a number of memory cell transistors is stored in positive logic or negative logic.

A semiconductor device of the present invention is provided with: a plurality of bit lines; a plurality of word lines, each of which is placed so as to cross the bit lines; a plurality of memory cell transistors, each of which is placed at an intersection between the plurality of bit lines and the plurality of word lines and has a gate connected to a word line, and each of which stores different data by making its drain connected or non-connected to a bit line; a word line selection circuit for selecting a word line from among the plurality of word lines; a bit line selection circuit for selecting a bit line from among the plurality of bit lines; a sense amplifier for determining the level of a bit line that has been selected via the bit line selection circuit in order to read out data of a memory cell transistor that corresponds to a word line that has been selected by the word line selection circuit and the bit line that has been selected by the bit line selection circuit; a data holding circuit having two output terminals for positive logic and negative logic, into which an output from the sense amplifier is inputted; and an output circuit of which an input terminal is connected to either one of the two output terminals of the data holding circuit.

In this configuration, the output terminal of the data holding circuit that is connected to the input terminal of the output circuit can simply be changed, making it possible to change the logic in a manner where the drains of memory cell transistors of which the number is smaller than those of the memory data "0" or "1" are connected to bit lines without requiring the addition of a circuit. Accordingly, the number of connections (contact portions) between the drains of memory cell transistors and bit lines can be decreased, and reduction in the yield can be prevented.

According to the present invention, it is preferable that the connection/non-connection between the drains of memory cell transistors and bit lines be made through the formation/non-formation of first contact portions for making electrical connections between the drains of memory cell transistors and bit lines, that the connection between one of the output terminals of the data holding circuit and the input terminal of the output circuit be made through the formation of a second contact portion for making an electrical connection between one of the output terminals of the data holding circuit and the input terminal of the output circuit, and that the first contact portions and the second contact portion be formed in the same process step.

As a result of this, even in the case where the memory data is determined or changed in the process for making connections between drains and bit lines in the memory cell array, the change in the logic and the connections between the drains of memory cell transistors and bit lines can be carried out in the same process step. Consequently, the number of contact portions for making connections between the drains of memory cell transistors and bit lines can be reduced.

In addition, according to the present invention, it is preferable to provide a test terminal in a manner where the input of the sense amplifier is fixed at the grounding potential or a power supply potential when a test signal is inputted into the test terminal.

As a result of this, when a test signal is inputted into the test terminal at the time of the test mode so that the memory data of a memory cell transistor is read out, the input of the sense amplifier is fixed at the grounding potential/power supply potential, irrespectively of whether the memory data is "0" or "1." Consequently, the output logic of the sense amplifier that is inputted into the data holding circuit is fixed at "0"/"1," the output terminal of the positive logic of the data holding circuit is fixed at "0"/"1," and the output terminal of the negative logic of the data holding circuit is fixed at "1"/"0." Accordingly, in the case where the input of the sense amplifier is fixed at the grounding potential and the output circuit is connected to the output terminal of the positive logic of the data holding circuit, the output of the output circuit becomes "0." In this case, the plurality of memory cell transistors stores data in the positive logic. On the other hand, in the case where the output circuit is connected to the output terminal of the negative logic, the output of the output circuit becomes "1." In this case, the plurality of memory cell transistors stores data in the negative logic.

In addition, in the case where the input of the sense amplifier is fixed at the power supply potential and the output circuit is connected to the output terminal of the positive logic of the data holding circuit, the output of the output circuit becomes "1." In this case, the plurality of memory cell transistors stores data in the positive logic. Meanwhile, in the case where the output circuit is connected to the output terminal of the negative logic, the output of the output circuit becomes "0." In this case, the plurality of memory cell transistors stores data in the negative logic.

As described above, it can be easily confirmed whether the plurality of memory cell transistors stores data in the positive logic or in the negative logic.

In addition, according to the present invention, it is preferable to provide a charge circuit for charging a bit line that has been selected by the bit line selection circuit to the power supply potential via the bit line selection circuit from a first node, which is connected to the input of the sense amplifier, by charging the first node to the power supply potential, and in addition, it is preferable to provide a test terminal and a control circuit for prohibiting the charge circuit from charging the first node when a test signal is inputted into the test terminal, and for fixing the first node, which is connected to the input of the sense amplifier, at the grounding potential.

As a result of this, when a test signal is inputted into the test terminal at the time of the test mode so that the memory data of a memory cell transistor is read out, the input of the sense amplifier becomes of the grounding potential, irrespectively of whether the memory data is "0" or "1," and as described above, it can easily be confirmed that the plurality of memory cell transistors stores data in the positive logic or in the negative logic.

In addition, according to the present invention, it is preferable to provide a charge circuit for charging a bit line that has been selected by the bit line selection circuit to the power supply potential via the bit line selection circuit from a first node, which is connected to the input of the sense amplifier, by charging the first node to the power supply potential, and in addition, it is preferable to provide a test terminal and a control circuit for prohibiting the bit line selection circuit from selecting a bit line when a test signal is inputted into the test terminal.

As a result of this, when a test signal is inputted into the test terminal at the time of the test mode so that the memory data of a memory cell transistor is read out, the input of the sense amplifier becomes of the power supply potential, irrespectively of whether the memory data is "0" or "1," and as described above, it can easily be confirmed that the plurality of memory cell transistors stores data in the positive logic or in the negative logic.

In addition, according to the present invention, it is preferable to provide a charge circuit for charging a bit line that has been selected by the bit line selection circuit to the power supply potential via the bit line selection circuit from a first node, which is connected to the input of the sense amplifier, by charging the first node to the power supply potential, and in addition, it is preferable to provide a test terminal and a control circuit for prohibiting the word line selection circuit from selecting a word line when a test signal is inputted into the test terminal.

As a result of this, when a test signal is inputted into the test terminal at the time of the test mode so that the memory data of a memory cell transistor is read out, the input of the sense amplifier becomes of the power supply potential, irrespectively of whether the memory data is "0" or "1," and as described above, it can easily be confirmed that the plurality of memory cell transistors stores data in the positive logic or in the negative logic.

In addition, a semiconductor device of the present invention is provided with: a memory part having a plurality of bit lines; a plurality of word lines, each of which is placed so as to cross the bit lines; a plurality of memory cell transistors, each of which is placed at an intersection between the plurality of bit lines and the plurality of word lines and has a gate connected to a word line, and each of which stores different data by making its drain connected or non-connected to a bit line; a word line selection circuit for selecting a word line from among the plurality of word lines; a bit line selection circuit for selecting a bit line from among the plurality of bit lines; a sense amplifier for determining the level of a bit line that has been selected via the bit line selection circuit in order to read out data of a memory cell transistor that corresponds to a word line that has been selected by the word line selection circuit and a bit line that has been selected by the bit line selection circuit; a data holding circuit into which an output from the sense amplifier is inputted; and an output circuit into which an output of the data holding circuit is inputted; a buffer circuit having two output terminals for positive logic and negative logic into which an output of the output circuit of the memory part is inputted; and a data processing circuit of which an input terminal is connected to either one of the two output terminals of the buffer circuit.

In this configuration, even in the case where the IP of the mask ROM of which the logic can be changed in accordance with the memory data cannot be utilized, the buffer circuit into which data from the memory part is inputted allows the logic to be changed without adding a large number of circuits, and thereby, the number of connections between the drains of memory cell transistors and bit lines can be reduced, preventing a reduction in the yield.

According to the present invention, it is preferable that the connection/non-connection between the drains of memory cell transistors and bit lines be made through the formation/non-formation of first contact portions for making electrical connections between the drains of memory cell transistors and bit lines, that the connection between one of the output terminals of the buffer circuit and the input terminal of the data processing circuit be made through the formation of a second contact portion for making an electrical connection between one of the output terminals of the buffer circuit and the input terminal of the data processing circuit, and that the first contact portions and the second contact portion be formed in the same process step.

As a result of this, even in the case where the memory data is determined or changed in the process for making connections between drains and bit lines in the memory cell array, the change in the logic and the connections between the drains of memory cell transistors and bit lines can be carried out in the same process step. Consequently, the number of contact portions for making connections between the drains of memory cell transistors and bit lines can be reduced.

In addition, a semiconductor device of the present invention is provided with: a memory part having a plurality of bit lines; a plurality of word lines, each of which is placed so as to cross the bit lines; a plurality of memory cell transistors, each of which is placed at an intersection between the plurality of bit lines and the plurality of word lines and has a gate connected to a word line, and each of which stores different data by making its drain connected or non-connected to a bit line; a word line selection circuit for selecting a word line from among the plurality of word lines; a bit line selection circuit for selecting a bit line from among the plurality of bit lines; a sense amplifier for determining the level of a bit line that has been selected via the bit line selection circuit in order to read out data of a memory cell transistor that corresponds to a word line that has been selected by the word line selection circuit and the bit line that has been selected by the bit line selection circuit; a data holding circuit into which an output from the sense amplifier is inputted; and an output circuit into which an output of the data holding circuit is inputted; and a data processing part formed of an input circuit having two output terminals for positive logic and negative logic into which an output of the output circuit of the memory part is inputted, and a data processing circuit of which an input terminal is connected to either one of the two output terminals of the input circuit.

In this configuration, even in the case where the IP of the mask ROM of which the logic can be changed in accordance with the memory data cannot be utilized, the input circuit of the data processing part, into which data from the memory part is inputted, allows the logic to be changed without adding a large number of circuits. Consequently, the number of connections between the drains of memory cell transistors and bit lines can be reduced, preventing a reduction in the yield.

According to the present invention, it is preferable that the connection/non-connection between the drains of memory cell transistors and bit lines be made through the formation/non-formation of first contact portions for making electrical connections between the drains of memory cell transistors and bit lines, that the connection between one of the output terminals of the input circuit of the data processing part and the input terminal of the data processing circuit be made through the formation of a second contact portion for making an electrical connection between one of the output terminals of the input circuit and the input terminal of the data processing circuit, and that the first contact portions and the second contact portion be formed in the same process step.

As a result of this, even in the case where the memory data is determined or changed in the process for making connections between drains and bit lines in the memory cell array, the change in the logic and the connections between the drains of memory cell transistors and bit lines can be carried out in the same process step, and thereby, the number of contact portions for making connections between the drains of memory cell transistors and bit lines can be reduced.

As described above, according to the semiconductor device of the present invention, the output terminal of the data holding circuit which is to be connected to the input terminal of the output circuit can simply be changed, making it possible to change the logic without requiring the addition of a circuit, in a manner where the drains of memory cell transistors of which the number is smaller than those of the memory data "0" or "1" are connected to bit lines. Consequently, the number of connections (contact portions) between the drains of memory cell transistors and bit lines can be reduced. As a result of this, a reduction in the yield caused by an increase in the number of layers and miniaturization of wires can be prevented.

Even in the case where the memory data is determined or changed in the process for making connections between drains and bit lines in the memory cell array, the change in the logic and the connection between the drains of memory cell transistors and bit lines can be made in the same process step. Consequently, the number of contact portions for making connections between the drains of memory cell transistors and bit lines can be reduced.

In addition, a test terminal is provided, and the input of the sense amplifier is fixed at the grounding potential or at a power supply potential when a test signal is inputted into the test terminal, and thereby, it becomes possible to easily confirm whether or not the plurality of memory cell transistors stores data in the positive logic or in the negative logic, that is to say, the relationships between whether or not the drains of memory cell transistors are connected to bit lines, and the respective data "0"/"1" from the output circuit. As a result of this, analysis can be made easy to carry out.

In addition, according to the semiconductor device of the present invention, even in the case where the IP of the mask ROM of which the logic can be changed in accordance with the memory data cannot be utilized, the buffer circuit into which data is inputted from the memory part allows the logic to be changed without adding a large number of circuits, and thereby, the number of connections (contact portions) between the drains of memory cell transistors and bit lines can be reduced. As a result of this, a reduction in the yield caused by an increase in the number of layers and miniaturization of wires can be prevented.

Here also, even in the case where the memory data is determined or changed in the process for making connections between drains and bit lines in the memory cell array, the change in the logic and the connection between the drains of memory cell transistors and bit lines can be made in the same process step. Consequently, the number of contact portions for making connections between the drains of memory cell transistors and bit lines can be reduced.

In addition, according to the semiconductor device of the present invention, even in the case where the IP of the mask ROM of which the logic can be changed in accordance with the memory data cannot be utilized, the input circuit of the data processing part into which data is inputted from the memory part allows the logic to be changed without adding a large number of circuits, and thereby, the number of connections (contact portions) between the drains of memory cell transistors and bit lines can be reduced. As a result of this, a reduction in the yield caused by an increase in the number of layers and miniaturization of wires can be prevented.

Here also, even in the case where the memory data is determined or changed in the process for making connections between drains and bit lines in the memory cell array, the change in the logic and the connection between the drains of memory cell transistors and bit lines can be made in the same process step. Consequently, the number of contact portions for making connections between the drains of memory cell transistors and bit lines can be reduced.

DESCRIPTION OF THE PREFERRED EMBODIMENTS

First Embodiment

Figure 1:
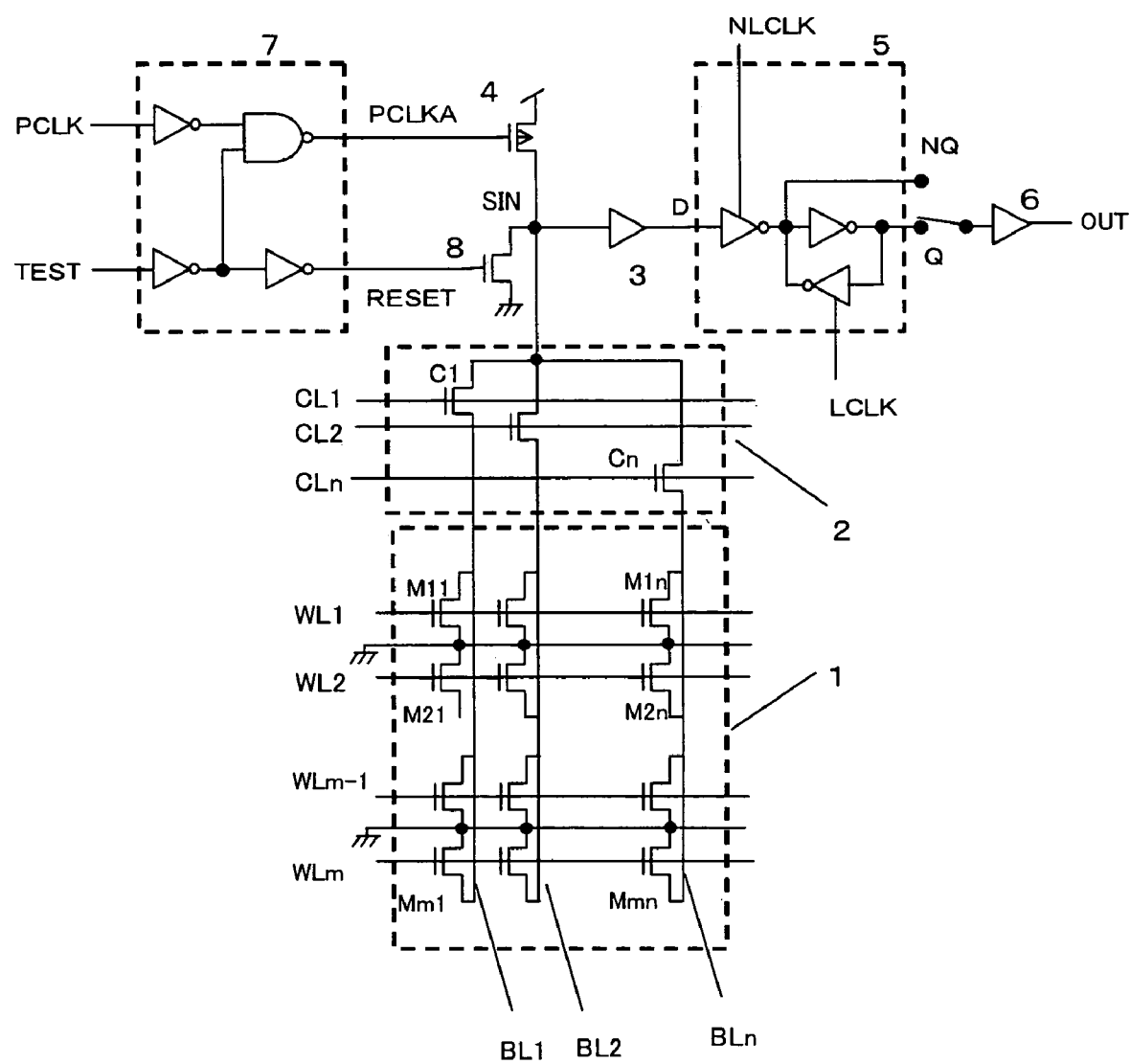
FIG. 1 is a diagram showing the configuration of a semiconductor device according to the first embodiment of the present invention.

FIG. 1 is a circuit diagram showing the configuration of a semiconductor device, that is to say, a mask ROM, according to the first embodiment of the present invention.

The semiconductor device of this embodiment is, as shown in FIG. 1, formed of a memory cell array 1, a column decoder 2, a sense amplifier 3, a transistor for charging 4, a latch circuit 5, an output buffer circuit 6, a charge signal control circuit 7 and a transistor for discharging 8. Memory cell array 1, column decoder 2, sense amplifier 3, transistor for charging 4 and output buffer circuit 6 are the same as those in the prior art, and therefore, the same symbols are attached to the same components, and the descriptions thereof are omitted.

Latch circuit 5, of which the input terminal is connected to the output of sense amplifier 3, outputs a signal in the same logic as that of an input D to an output terminal Q, and outputs a signal in the negative logic to an output terminal NQ when a latch control signal LCLK is "L" and a latch control signal NLCLK is "H." In addition, latch circuit S maintains the output conditions of output terminal Q and output terminal NQ when latch control signal LCLK is "H" and latch control signal NLCLK is "L."

Charge signal control circuit 7, into which a charge control signal PCLK and a test control signal TEST are inputted, outputs a signal PCLKA which is inputted into the gate of transistor for charging 4, and outputs a signal RESET which is inputted into the gate of transistor for discharging 8. Charge control signal PCLKA becomes the same signal as latch control signal PCLK and signal RESET becomes "L" when test control signal TEST is "L." Charge control signal PCLKA becomes "L" and signal RESET becomes "H" when test control signal TEST is "H." Here, the semiconductor device of the present embodiment is provided with a test terminal (not shown) into which test control signal TEST is inputted from the outside.

Transistor for discharging 8 is formed of an N type MOS transistor. The gate of transistor for discharging 8 is connected to signal RESET, the source is connected to a power supply terminal that has the grounding potential, and the drain is connected to the drains of N type MOS transistors Cj (j=1 to n) that form column decoder 2 and to the input of sense amplifier 3.

Figure 2:
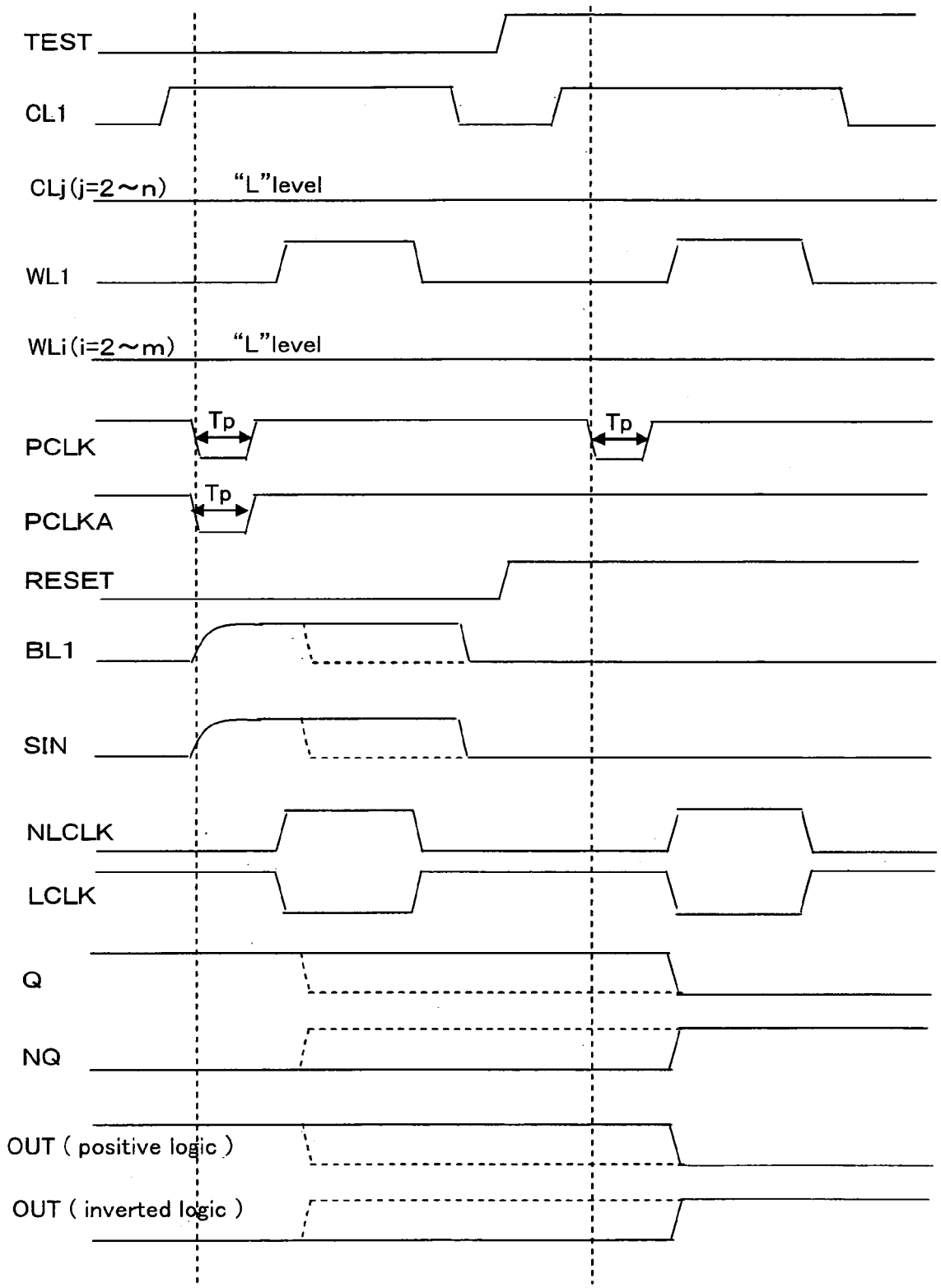
FIG. 2 is a timing chart showing the operation of the semiconductor device according to the first embodiment of the present invention.

The operation of reading out data in memory cell M11, for example, in the semiconductor device that is formed as described above is described in reference to the timing chart of FIG. 2.

First, the time when test control signal TEST is at the "L" level (normal operation mode) is described.

Column selection signal CL1 from among column selection signals CLj (j=1 to n) is set at the "H" level, and column selection signals CL2 to CLn are set at the "L" level. As a result of this, N type MOS transistor C1 from among N type MOS transistors Cj (j=1 to n) that form column decoder 2 is set to the ON condition, and the other N type MOS transistor C2 to Cn are set to the OFF condition.

Next, pre-charge control signal PCLK is set at the "L" level during a certain period of time Tp. Thus, signal PCLKA that is connected to the gate of transistor for pre-charging 4 also becomes of the ON condition during this period of time Tp. As a result of this, bit line BL1 is charged to the "H" level.

After bit line BL1 has become of the "H" level, word line selection signal WL1 from among word line selection signals WLi (i=1 to m) is switched from the "L" level to the "H" level, and the other word line selection signals WL2 to WLm are maintained at the "L" level.

As a result of this, in the case where the drain of memory cell M11 is connected to bit line BL1, the charge that has charged bit line BL1 is discharged by memory cell M11 so as to convert bit line BL1 to the "L" level, and the input of sense amplifier 3 also becomes of the "L" level. In addition, as for latch control signals LCLK and NLCLK of latch circuit 5, when a word line from among word line selection signals WLi (i=1 to m) is selected, latch control signal LCLK is at the "L" level and latch control signal NLCLK is at the "H" level. Accordingly, the output of sense amplifier 3 becomes of the "L" level, output Q of latch circuit 5 becomes of the "L" level, and output NQ becomes of the "H" level. In the case where output end Q of latch circuit 5 is connected to output buffer circuit 6 in the setting of the positive logic, "L" is read out from output terminal OUT. In addition, in the case where output end NQ of latch circuit 5 is connected to output buffer circuit 6 in the setting of the negative logic, "H" is read out from output terminal OUT (shown by broken lines in FIG. 2).

In addition, in the case where the drain of memory cell M11 is not connected to bit line BL1, the charge that has charged bit line BL1 is not discharged by memory cell M11, and bit line BL1 maintains the "H" level and the input of sense amplifier 3 also becomes of the "H" level. In addition, as for latch control signals LCLK and NLCLK of latch circuit 5, when a word line from among word line selection signals WLi (i=1 to m) is selected, latch control signal LCLK is at the "L" level and latch control signal NLCLK is at the "H" level, and the output of sense amplifier 3 becomes of the "H" level, output Q of latch circuit 5 becomes of the "H" level and output NQ becomes of the "L" level. In the case where output end Q of latch circuit 5 is connected to output buffer circuit 6 in the setting of the positive logic, "H" is read out from output terminal OUT. In addition, in the case where output end NQ of latch circuit 5 is connected to output buffer circuit 6 in the setting of the negative logic, "L" is read out from output terminal OUT (shown by solid lines in FIG. 2).

Next, when test control signal TEST is at the "H" level (test mode), signal PCLKA that is connected to the gate of transistor for pre-charging 4 becomes "H" and signal RESET that is connected to the gate of transistor for discharging 8 becomes "H." Therefore, bit line BL1 and the input of sense amplifier 3 become of the "L" level. Thus, the output of sense amplifier 3 becomes of the "L" level, output Q of latch circuit 5 becomes of the "L" level, and output NQ becomes of the "H" level. In the case where output end Q of latch circuit 5 is connected to output buffer circuit 6 in the setting of the positive logic, "L" is read out from output terminal OUT. In addition, in the case where output end NQ of latch circuit 5 is connected to output buffer circuit 6 in the setting of the negative logic, "H" is read out from output terminal OUT.

In the present embodiment, output ends Q and NQ of latch circuit 5 which is to be connected to output buffer circuit 6 can simply be switched without requiring the addition of a circuit, and thereby, the relationship between the data "0" and "1," and whether or not the drains of memory cells Mij (i=1 to m, j=1 to n) are connected to bit lines BLj (j=1 to n) can be changed (change in the logic). Consequently, it becomes possible to reduce the number of connections of the drains of memory cells Mij (i=1 to m, j=1 to n) to bit lines BLj (j=1 to n). As a result of this, a reduction in the yield caused by an increase in the number of layers and miniaturization of wires can be prevented.

In the present embodiment, it is preferable that the connection/non-connection between the drains of memory cells Mij and bit lines BLj be made through the formation/non-formation of first contact portions (via portions) for making electrical connections between the drains and bit lines, that the connections between output end Q or NQ of latch circuit 5 and output buffer circuit be made through the formation of a second contact portion (via portion) for making an electrical connection between output end Q or NQ and the input terminal of output buffer circuit 6, and that the first contact portions and the second contact portion be formed in the same process step. As a result of this, even in the case where the memory data is determined or changed in the process for making connections between the drains of memory cells Mij and bit lines BLj, the change in the logic and the connections between the drains of memory cells Mij and bit lines BLj can be made in the same process step. Consequently, the number of the contact portions for making connections between the drains of memory cells Mij and bit lines BLj can be reduced.

In addition, the charge operation can be controlled by means of test control signal TEST, and thereby, the positive logic can easily be confirmed in the case where the output of output buffer circuit 6 is "L" and the negative logic can easily be confirmed in the case where the output is "H." As a result of this, analysis can be made easy to carry out.

Second Embodiment

Figure 3:
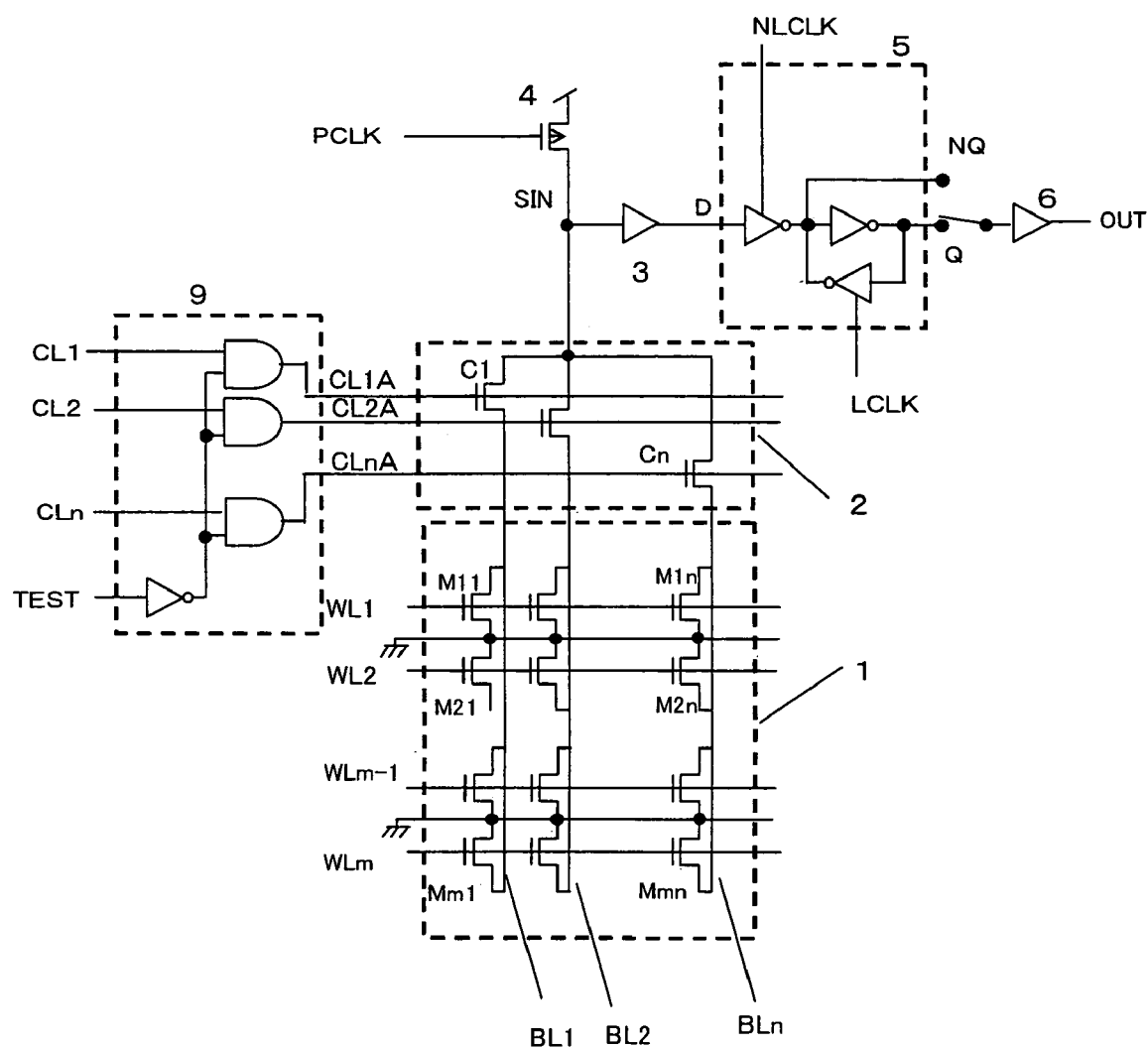
FIG. 3 is a diagram showing the configuration of a semiconductor device according to the second embodiment of the present invention.

FIG. 3 is a circuit diagram showing the configuration of a semiconductor device, that is to say, a mask ROM, according to the second embodiment of the present invention.

The semiconductor device of this embodiment is, as shown in FIG. 3, formed of a memory cell array 1, a column decoder 2, a sense amplifier 3, a transistor for charging 4, a latch circuit 5, an output buffer circuit 6 and a column signal control circuit 9. Memory cell array 1, column decoder 2, sense amplifier 3, transistor for charging 4, latch circuit 5 and output buffer circuit 6 are the same as those in the prior art and in the first embodiment, and therefore, the same symbols are attached to the same components, and descriptions thereof are omitted. In addition, the semiconductor device of the present embodiment is also provided with a test terminal (not shown) into which a test control signal TEST is inputted from the outside.

Column signal control circuit 9, into which column selection signals CLj (j=1 to n) and test control signal TEST are inputted, outputs signals CLAj (j=1 to n), which are inputted into the gates of column decoder 2.

Figure 4:
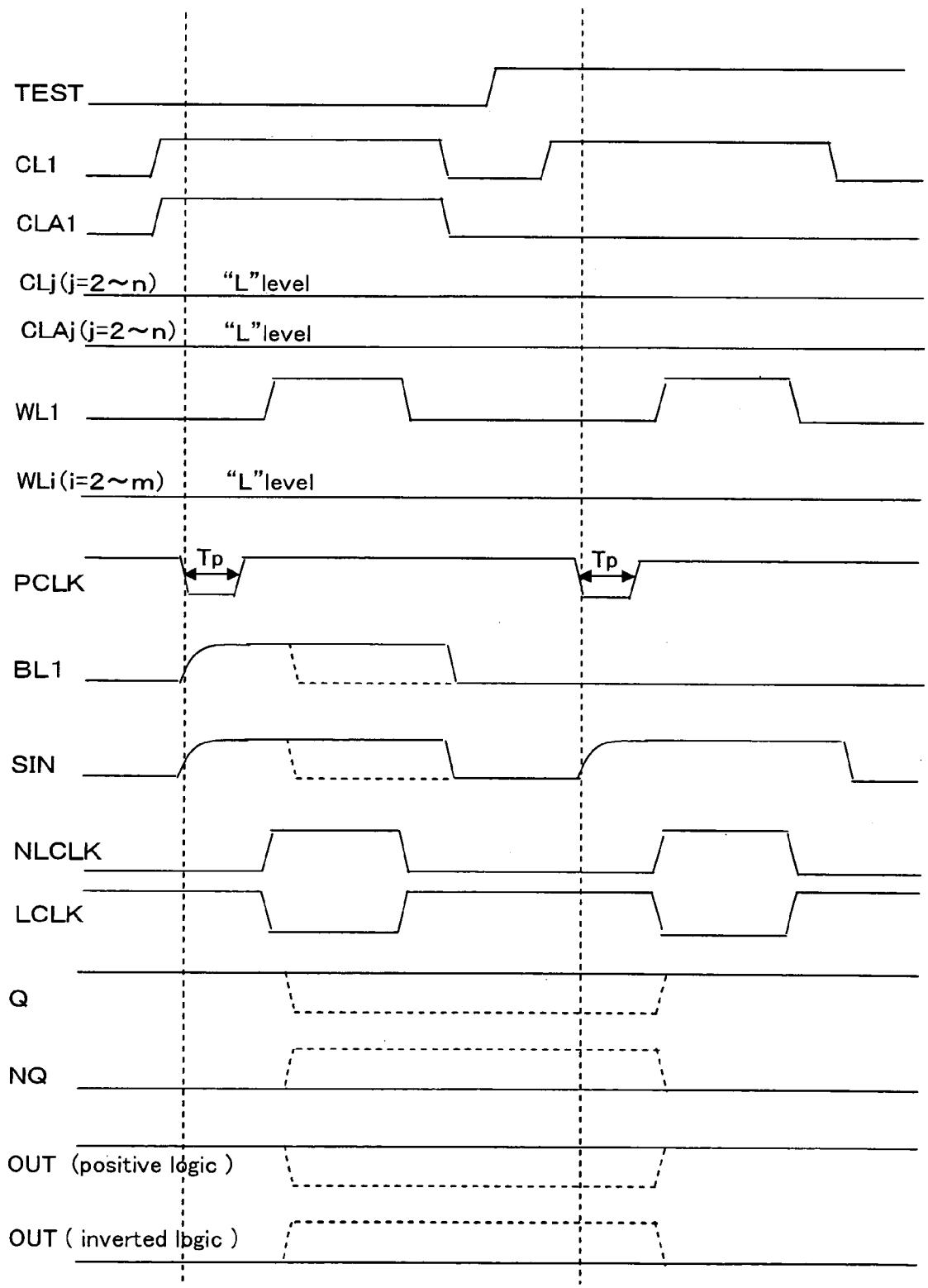
FIG. 4 is a timing chart showing the operation of the semiconductor device according to the second embodiment of the present invention.

The operation of reading out data in, for example, memory cell M11, in the semiconductor device that is configured as described above is described in reference to the timing chart of FIG. 4.

When test control signal TEST is at the "L" level, the operation is the same as that in the first embodiment.

When test control signal TEST is at the "H" level, signals CLAj (j=1 to n) which are inputted into the gates of N type MOS transistor Cj (j=1 to n) that form column decoder 2 all become "L."

When pre-charge control signal PCLK is set at the "L" level during period of time Tp, the input node of sense amplifier 3 is charged to the "H" level by transistor for pre-charging 4. Bit line BL1 is not charged, because N type MOS transistor C1 that forms column decoder 2 is in the OFF condition.

Next, word line selection signal WL1 from among word line selection signals WLi (i=1 to m) is converted from the "L" level to the "H" level, and the other word line selection signals WL2 to WLm are maintained at the "L" level. Meanwhile, the input portion of sense amplifier 3 maintains the "H" level, irrespectively of the connection or non-connection between the drain of memory cell M11 and bit line BL1, because Cj (j=1 to n) that form column decoder 2 are in the OFF condition. Accordingly, the output of sense amplifier 3 becomes of the "H" level, output Q of latch circuit 5 becomes of the "H" level, and output NQ becomes of the "L" level. In the case where output end Q of latch circuit 5 is connected to output buffer circuit 6 in the setting of the positive logic, "H" is read out from output terminal OUT. In addition, in the case where output end NQ of latch circuit 5 is connected to output buffer circuit 6 in the setting of the negative logic, "L" is read out from output terminal OUT.

In the present embodiment, it is possible to reduce the number of drains of memory cells Mij (i=1 to m, j=1 to n) which are connected to bit lines BLj (j=1 to n) in the same manner as in the first embodiment, by switching output ends Q and NQ of latch circuit 5 which are to be connected to output buffer circuit 6. As a result of this, a reduction in the yield caused by an increase in the number of layers and miniaturization of wires can be prevented.

In the present embodiment, it is preferable that connection/non-connection between the drains of memory cells Mij and bit lines BLj be achieved through the formation/non-formation of first contact portions (via portions) for making electrical connections between the drains and the bit lines, that the connection between output end Q or NQ of latch circuit 5 and output buffer circuit 6 be made through the formation of a second contact portion (via portion) for making an electrical connection between output end Q or NQ and the input terminal of output buffer circuit 6, and that the first contact portions and the second contact portion be formed in the same process step. As a result of this, even in the case where the memory data is determined or changed in the process for connecting the drains of memory cells Mij to bit lines BLj, the change in the logic, and the connections between the drains of memory cells Mij and bit lines BLj can be made in the same process step. Consequently, the number of contact portions for making connections between the drains of memory cells Mij and bit lines BLj can be reduced.

In addition, column decoder 2 can be controlled by means of test control signal TEST, and thereby, the positive logic can easily be confirmed in the case where the output of output buffer circuit 6 is "H" and the negative logic can easily be confirmed in the case where the output is "L." As a result of this, analysis can be made easy to carry out.

Third Embodiment

Figure 5:
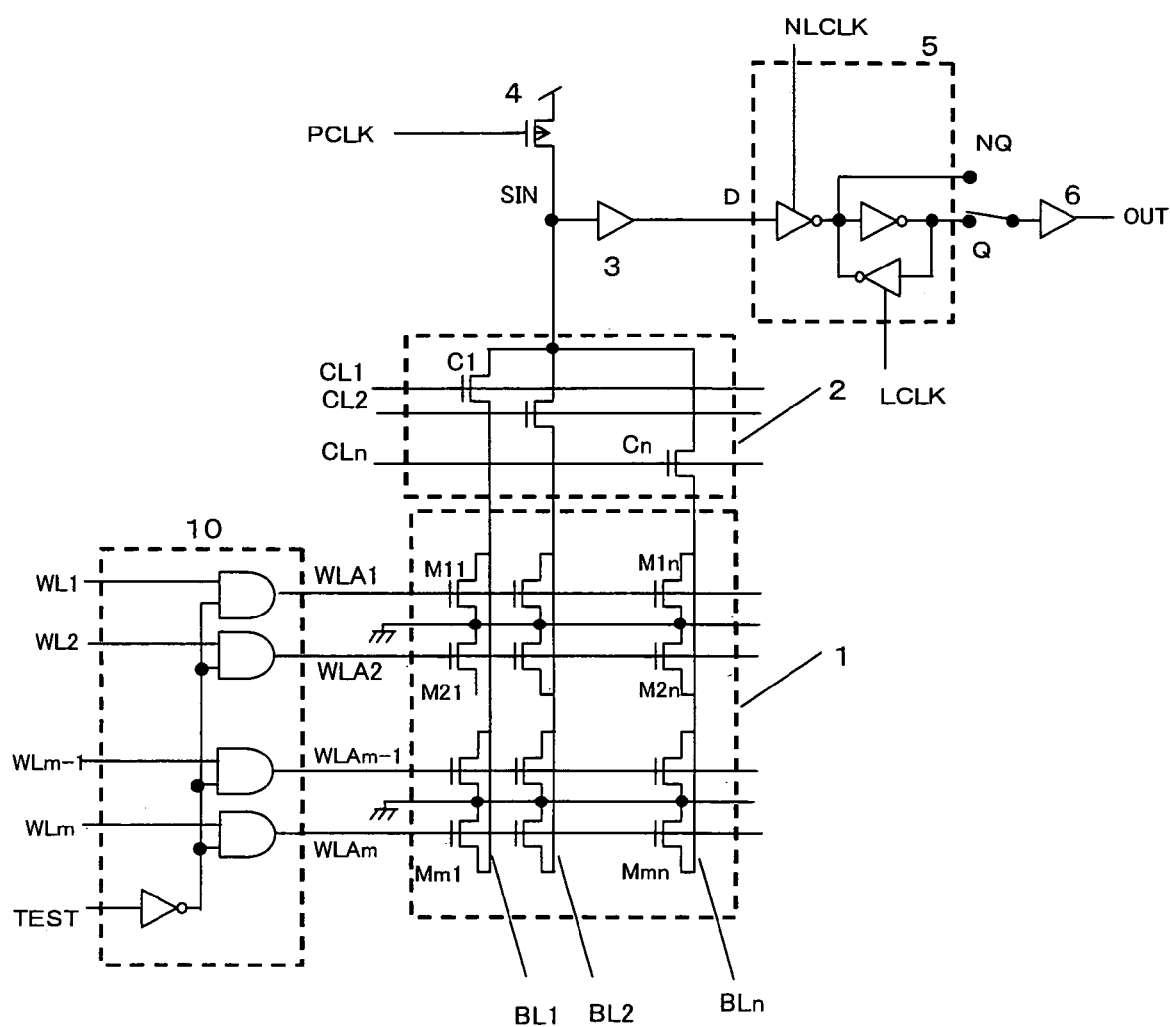
FIG. 5 is a diagram showing the configuration of a semiconductor device according to the third embodiment of the present invention.

FIG. 5 is a circuit diagram showing the configuration of a semiconductor device, that is to say, a mask ROM, according to the third embodiment of the present invention.

The semiconductor device of this embodiment is, as shown in FIG. 5, formed of a memory cell array 1, a column decoder 2, a sense amplifier 3, a transistor for charging 4, a latch circuit 5, an output buffer circuit 6 and a word line control circuit 10. Memory cell array 1, column decoder 2, sense amplifier 3, transistor for charging 4, latch circuit 5 and output buffer circuit 6 are the same as those in the prior art and in the first embodiment, and therefore, the same symbols are attached to the same components, and descriptions thereof are omitted. In addition, the semiconductor device of the present embodiment is also provided with a test terminal (not shown) into which a test control signal TEST is inputted from the outside.

Word line control circuit 10, into which word line selection signals WLi (i=1 to m) and test control signal TEST are inputted, outputs word line selection signals WLAi (i=1 to m), which are inputted into the gates of memory cells Mij (i=1 to m, j=1 to n).

Figure 6:
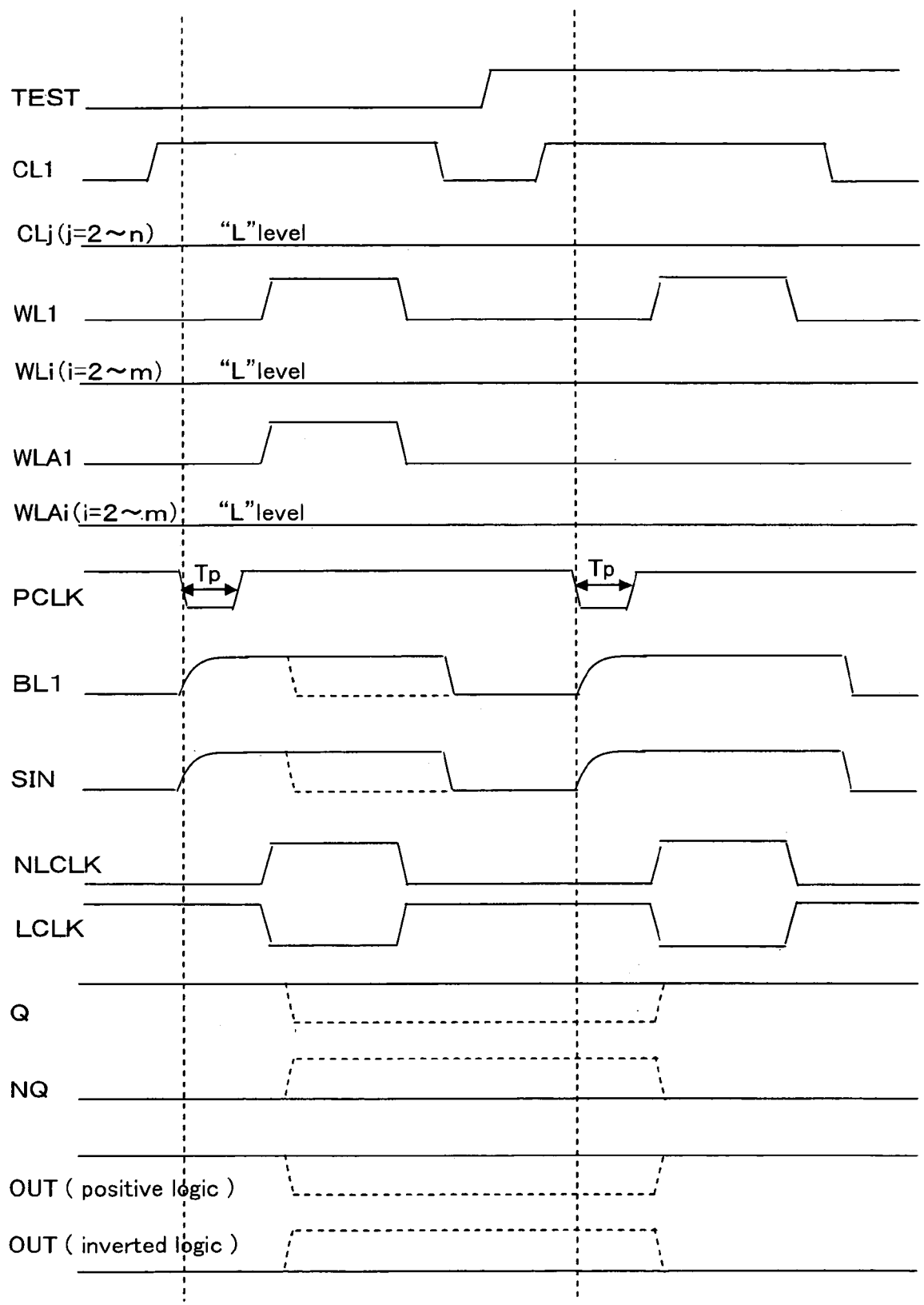
FIG. 6 is a timing chart showing the operation of the semiconductor device according to the third embodiment of the present invention.

The operation of reading out data in, for example, memory cell M11 in the semiconductor device that is formed as described above, is described in reference to the timing chart of FIG. 6.

When test control signal TEST is at the "L" level, the operation is the same as that of the first embodiment.

When test control signal TEST is at the "H" level, word line selection signals WLAi (i=1 to m) which are inputted into the gates of memory cells Mij (i=1 to m, j=1 to n) all become of the "L" level.

Column selection signal CL1 from among column selection signals CLj (j=1 to n) is set at the "H" level, and column selection signals CL2 to CLn are set at the "L" level, and thereby, N type MOS transistor C1 from among N type MOS transistors Cj (j=1 ton) that form column decoder 2 is set to the ON condition, and the other N type MOS transistors C2 to Cn are set to the OFF condition.

Next, when pre-charge control signal PCLK which is connected to the gate of transistor for pre-charging 4 is set to the "L" level for period of time Tp, bit line BL1 is charged to the "H" level.

After bit line BL1 has become of the "H" level, word line selection signal WL1 from among word line selection signals WLi (i=1 to m) is switched from the "L" level to the "H" level, and the other word line selection signals WL2 to WLm are maintained at the "L" level. Meanwhile, word line selection signal WLA1 is at the "L" level, and therefore, the input portion of sense amplifier 3 maintains the "H" level, irrespectively of the connection/non-connection between the drain of memory cell M11 and bit line BL1. Accordingly, the output of sense amplifier 3 becomes of the "H" level, output Q of latch circuit 5 becomes of the "H" level, and output NQ becomes of the "L" level. In the case where output end Q of latch circuit 5 is connected to output buffer circuit 6 in the setting of the positive logic, "H" is read out from output terminal OUT. In addition, in the case where output end NQ of latch circuit 5 is connected to output buffer circuit 6 in the setting of the negative logic, "L" is read out from output terminal OUT.

In the present embodiment, it is possible to reduce the number of drains of memory cells Mij (i=1 to m, j=1 to n) which are connected to bit lines BLj (j=1 to n) in the same manner as in the first embodiment, by switching output ends Q and NQ of latch circuit 5 which are to be connected to output buffer circuit 6. As a result of this, a reduction in the yield caused by an increase in the number of layers and miniaturization of wires can be prevented.

In the present embodiment, it is preferable that connection/non-connection between the drains of memory cells Mij and bit lines BLj be achieved through the formation/non-formation of first contact portions (via portions) for making electrical connections between the drains and the bit lines, that the connection between output end Q or NQ of latch circuit 5 and output buffer circuit 6 be made through the formation of a second contact portion (via portion) for making an electrical connection between output end Q or NQ and the input terminal of output buffer circuit 6, and that the first contact portions and the second contact portion be formed in the same process step. As a result of this, even in the case where the memory data is determined or changed in the process for connecting the drains of memory cells Mij to bit lines BLj, the change in the logic, and the connections between the drains of memory cells Mij and bit lines BLj can be made in the same process step. Consequently, the number of contact portions for making connections between the drains of memory cells Mij and bit lines BLj can be reduced.

In addition, word line selection signals WLAi (i=1 to m) can be controlled by means of test control signal TEST, and thereby, the positive logic can easily be confirmed in the case where the output of output buffer circuit 6 is "H" and the negative logic can easily be confirmed in the case where the output is "L." As a result of this, analysis can be made easy to carry out.

Fourth Embodiment

Figure 7:
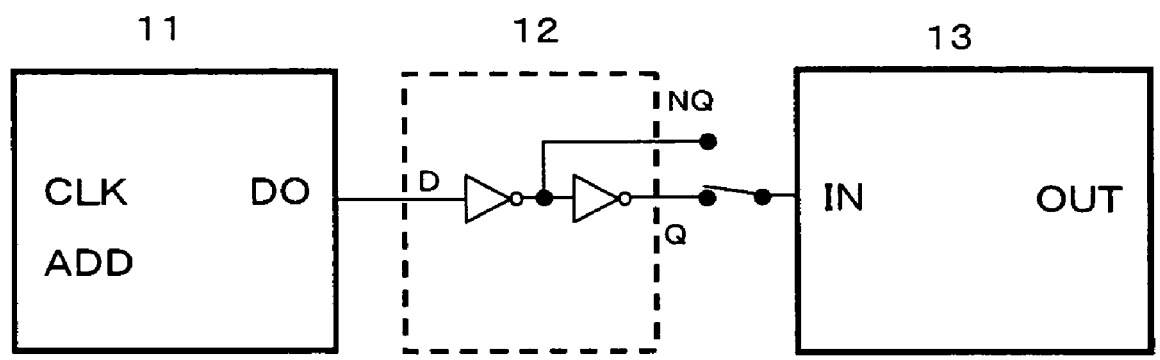
FIG. 7 is a diagram showing the configuration of a semiconductor device according to the fourth embodiment of the present invention.

FIG. 7 is a circuit diagram showing the configuration of a semiconductor device according to the fourth embodiment of the present invention.

The semiconductor device of this embodiment is, as shown in FIG. 7, formed of a conventional mask ROM 11, a buffer circuit 12 and a data processing circuit 13.

Figure 9:
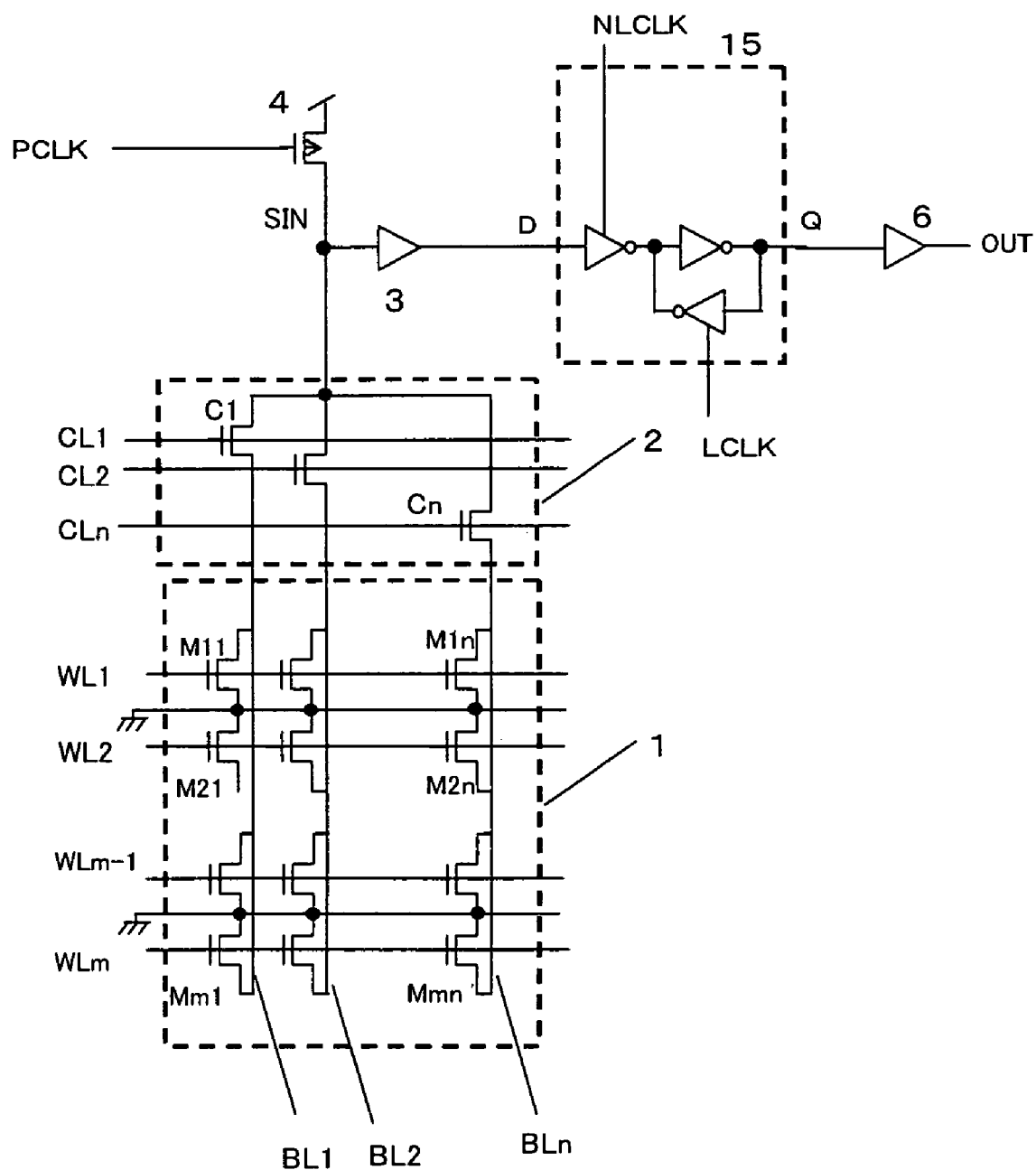
FIG. 9 is a diagram showing the configuration of a semiconductor device according to the prior art.
Figure 10:
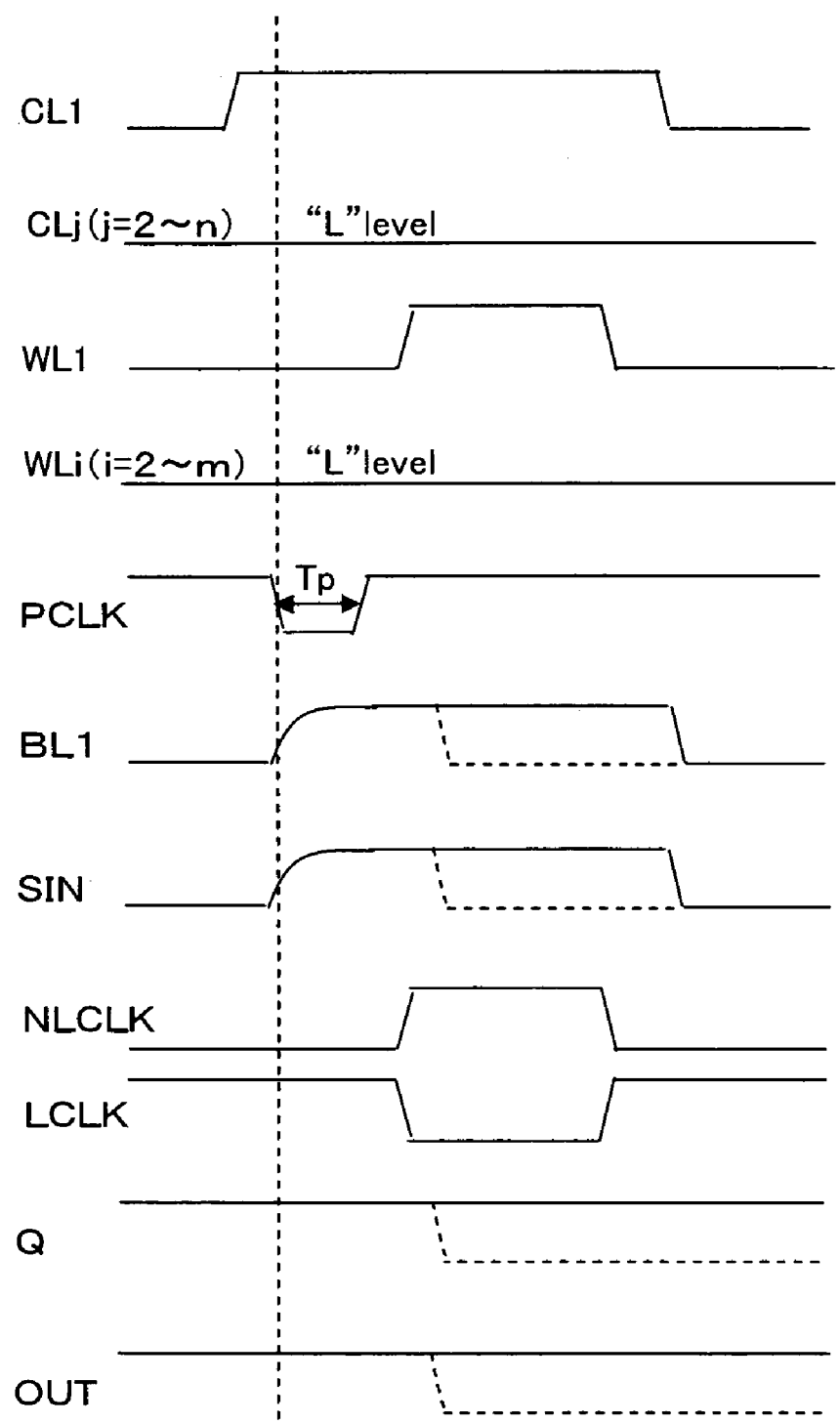
FIG. 10 is a timing chart showing the operation of the semiconductor device according to the prior art.

Mask ROM 11 is a semiconductor device having the configuration of FIG. 9 which is described as the prior art, and the relationship between the memory data of "0" or "1" and the existence or non-existence of the connection of the drain of a memory cell transistor to a bit line is fixed.

Buffer circuit 12 is a buffer circuit having an input end D, an output end Q for positive logic, and an output end NQ for negative logic.

Data processing circuit 13 is a circuit into which memory data is inputted, and which carries out data processing so as to output the processing result. A processor (CPU core or DSP core) or the like can be cited as a concrete example of this data processing circuit 13.

The semiconductor device which is formed as described above is described below.

In the case where output end Q of buffer circuit 12 is connected to the input of data processing circuit 13, "L" is inputted into the input of data processing circuit 13 when the output of mask ROM 11 is "L," and "H" is inputted into the input of data processing circuit 13 when the output of mask ROM 11 is "H."

In addition, in the case where output terminal NQ of buffer circuit 12 is connected to the input of data processing circuit 13, "H" is inputted into the input of data processing circuit 13 when the output of mask ROM 11 is "L," and "L" is inputted into the input of data processing circuit 13 when the output of mask ROM is "H."

According to the present embodiment, the relationship between the data of "0" or "1" and the drains of memory cells Mij (i=1 to m, j=1 to n) which are connected or not connected to bit lines BLj (j=1 to n) in the mask ROM of FIG. 9 can be changed by switching the connection between output end Q or NQ of buffer circuit 12 and the input of data processing circuit 13. Therefore, it is possible to reduce the number of drains of memory cells Mij (i=1 to m, j=1 to n) which are connected to bit lines BLj (j=1 to n). As a result of this, a reduction in the yield caused by an increase in the number of layers and miniaturization of wires can be prevented. Accordingly, even in the case where a semiconductor device (mask ROM) cannot be utilized according to the first to third embodiments of the present invention, it becomes possible to gain the same effects, according to the above described method.

In the present embodiment, it is preferable that connection/non-connection between the drains of memory cells Mij and bit lines BLj be achieved through the formation/non-formation of first contact portions (via portions) for making electrical connections between the drains and the bit lines, that the connection between output end Q or NQ of buffer circuit 12 and data processing circuit 13 be made through the formation of a second contact portion (via portion) for making an electrical connection between output end Q or NQ and the input terminal of data processing circuit 13, and that the first contact portions and the second contact portion be formed in the same process step. As a result of this, even in the case where the memory data is determined or changed in the process for connecting the drains of memory cells Mij to bit lines BLj, the change in the logic, and the connections between the drains of memory cells Mij and bit lines BLj can be made in the same process step. Consequently, the number of contact portions for making connections between the drains of memory cells Mij and bit lines BLj can be reduced.

Fifth Embodiment

Figure 8:
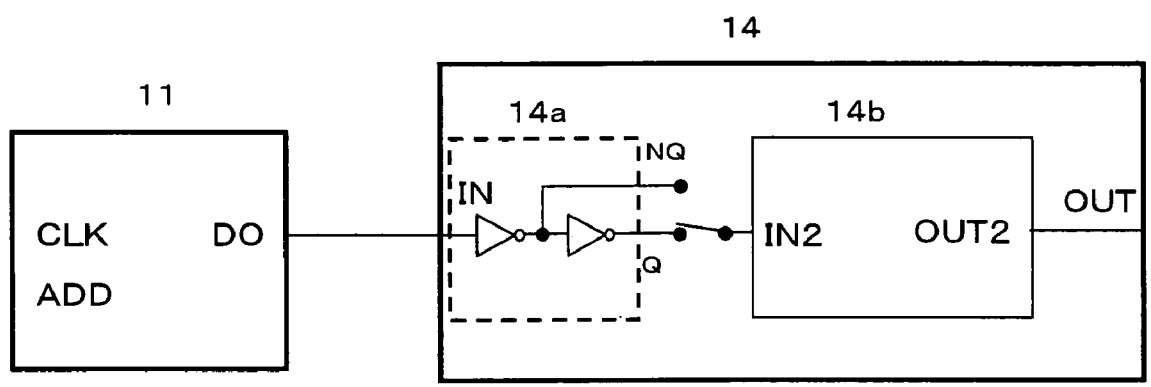
FIG. 8 is a diagram showing the configuration of a semiconductor device according to the fifth embodiment of the present invention.

FIG. 8 is a circuit diagram showing the configuration of a semiconductor device according to the fifth embodiment of the present invention.

The semiconductor device of this embodiment is, as shown in FIG. 8, formed of a conventional mask ROM 11 and a data processing circuit 14 having a circuit that makes switching of logic possible at the input portion. Mask ROM 11 is the same as that in the fourth embodiment and the same symbols are attached to the same components, and descriptions thereof are omitted.

Data processing circuit 14 has a node Q for positive logic and a node NQ for negative logic at an input portion 14*a* as the output nodes, making it possible to switch the connections to an internal circuit 14*a*. Input portion 14*a* of data processing circuit 14 has the same functions as buffer circuit 12 of FIG. 7, and internal circuit 14*b* has the same functions as data processing circuit 13 of FIG. 7.

The semiconductor device that is formed as described above is described below.

In the case where node Q of input portion 14*a* is connected to internal circuit 14*b* in data processing circuit 14, "L" is inputted into internal circuit 14*b* of data processing circuit 14 when the output of mask ROM 11 is "L," and "H" is inputted into internal circuit 14*b* of data processing circuit 14 when the output of mask ROM 11 is "H."

In addition, in the case where node NQ of input portion 14*a* is connected to internal circuit 14*b*, "H" is inputted into internal circuit 14*b* of data processing circuit 14 when the output of mask ROM 11 is "L," and "L" is inputted into internal circuit 14*b* of data processing circuit 14 when the output of mask ROM 11 is "H."

According to the present embodiment, the relationship between the data of "0" or "1" and the drains of memory cells Mij (i=1 to m, j=1 to n) which are connected or not connected to bit lines BLj (j=1 to n) in the mask ROM of FIG. 9 can be changed by switching the connection between node Q or node NQ at input portion 14*a* of data processing circuit 14 and the input of internal circuit 14*b*. Consequently, it is possible to reduce the number of drains of memory cells Mij (i=1 to m, j=1 to n) which are connected to bit lines BLj (j=1 to n). As a result of this, a reduction in the yield caused by an increase in the number of layers and miniaturization of wires can be prevented. Accordingly, even in the case where a semiconductor device (mask ROM) cannot be utilized according to the first to third embodiments of the present invention, it becomes possible to gain the same effects, according to the above described method.

In the present embodiment, it is preferable that connection/non-connection between the drains of memory cells Mij and bit lines BLj be achieved through the formation/non-formation of first contact portions (via portions) for making electrical connections between the drains and the bit lines, that the connection between output end Q or NQ at input portion 14*a* of data processing circuit 14 and internal circuit 14*b* be made through the formation of a second contact portion (via portion) for making an electrical connection between output end Q or NQ and the input terminal of internal circuit 14*b*, and that the first contact portions and the second contact portion be formed in the same process step. As a result of this, even in the case where the memory data is determined or changed in the process for connecting the drains of memory cells Mij to bit lines BLj, the change in the logic, and the connections between the drains of memory cells Mij and bit lines BLj can be made in the same process step. Consequently, the number of contact portions for making connections between the drains of memory cells Mij and bit lines BLj can be reduced.

INDUSTRIAL APPLICABILITY

A semiconductor device according to the present invention provides a technique for reducing the number of connections between memory cells and bit lines in a mask ROM, which is useful as a technique for preventing a decrease in the yield caused by an increase in the number of layers and miniaturization of wires in the manufacturing process. In addition, a technique for fixing the input of the sense amplifier at the time of testing is provided, which is useful for confirming the relationship between the memory data of a mask ROM and the connections of memory cells to bit lines.

The invention claimed is:

1. A semiconductor device, comprising:
a plurality of bit lines;
a plurality of word lines, each of which is placed so as to cross said bit lines;
a plurality of memory cell transistors, each of which is placed at an intersection between said plurality of bit lines and said plurality of word lines and has a gate connected to a word line of the plurality of word lines, and each of which stores different data by making its drain connected or non-connected to a bit line of the plurality of bit lines;
a word line selection circuit that selects a word line from among said plurality of word lines;
a bit line selection circuit that selects a bit line from among said plurality of bit lines;
a sense amplifier that determines the level of a bit line that has been selected via said bit line selection circuit in order to read out data of a memory cell transistor that corresponds to a word line that has been selected by said word line selection circuit and said bit line that has been selected by said bit line selection circuit;
a data holding circuit having two output terminals for positive logic and negative logic, into which an output from said sense amplifier is inputted; and
an output circuit of which an input terminal is connected to either one of the two output terminals of said data holding circuit, wherein:
the connection/non-connection between the drains of memory cell transistors and bit lines is made through the formation/non-formation of first contact portions for making electrical connections between the drains of memory cell transistors and bit lines,
the connection between one of the output terminals of said data holding circuit and the input terminal of said output circuit is made through the formation of a second contact portion for making an electrical connection between one of the output terminals of said data holding circuit and the input terminal of said output circuit, and said first contact portions and said second contact portion are formed in a same process step.

2. A semiconductor device, comprising:

a plurality of bit lines;

a plurality of word lines, each of which is placed so as to cross said bit lines;

a plurality of memory cell transistors, each of which is placed at an intersection between said plurality of bit lines and said plurality of word lines and has a gate connected to a word line of the plurality of word lines, and each of which stores different data by making its drain connected or non-connected to a bit line of the plurality of bit lines;

a word line selection circuit that selects a word line from among said plurality of word lines;

a bit line selection circuit that selects a bit line from among said plurality of bit lines;

a sense amplifier that determines the level of a bit line that has been selected via said bit line selection circuit in order to read out data of a memory cell transistor that corresponds to a word line that has been selected by said word line selection circuit and said bit line that has been selected by said bit line selection circuit;

a data holding circuit having two output terminals for positive logic and negative logic, into which an output from said sense amplifier is inputted;

an output circuit of which an input terminal is connected to either one of the two output terminals of said data holding circuit; and a test terminal that fixes the input of said sense amplifier at the grounding potential or a power supply potential when a test signal is inputted into said test terminal.

3. A semiconductor device, comprising:

a plurality of bit lines;

a plurality of word lines, each of which is placed so as to cross said bit lines;

a plurality of memory cell transistors, each of which is placed at an intersection between said plurality of bit lines and said plurality of word lines and has a gate connected to a word line of the plurality of word lines, and each of which stores different data by making its drain connected or non-connected to a bit line of the plurality of bit lines;

a word line selection circuit that selects a word line from among said plurality of word lines;

a bit line selection circuit that selects a bit line from among said plurality of bit lines;

a sense amplifier that determines the level of a bit line that has been selected via said bit line selection circuit in order to read out data of a memory cell transistor that corresponds to a word line that has been selected by said word line selection circuit and said bit line that has been selected by said bit line selection circuit;

a data holding circuit having two output terminals for positive logic and negative logic, into which an output from said sense amplifier is inputted;

an output circuit of which an input terminal is connected to either one of the two output terminals of said data holding circuit;

a charge circuit that charges a bit line that has been selected by said bit line selection circuit to the power supply potential via said bit line selection circuit from a first node, which is connected to the input of said sense amplifier, by charging said first node to the power supply potential; and a test terminal and a control circuit that prohibits said charge circuit from charging said first node when a test signal is inputted into said test terminal, and that fixes said first node, which is connected to the input of said sense amplifier, at the grounding potential.

4. A semiconductor device, comprising:

a plurality of bit lines;

a plurality of word lines, each of which is placed so as to cross said bit lines;

a plurality of memory cell transistors, each of which is placed at an intersection between said plurality of bit lines and said plurality of word lines and has a gate connected to a word line of the plurality of word lines, and each of which stores different data by making its drain connected or non-connected to a bit line of the plurality of bit lines;

a word line selection circuit that selects a word line from among said plurality of word lines;

a bit line selection circuit that selects a bit line from among said plurality of bit lines;

a sense amplifier that determines the level of a bit line that has been selected via said bit line selection circuit in order to read out data of a memory cell transistor that corresponds to a word line that has been selected by said word line selection circuit and said bit line that has been selected by said bit line selection circuit;

a data holding circuit having two output terminals for positive logic and negative logic, into which an output from said sense amplifier is inputted;

an output circuit of which an input terminal is connected to either one of the two output terminals of said data holding circuit;

a charge circuit that charges a bit line that has been selected by said bit line selection circuit to the power supply potential via said bit line selection circuit from a first node, which is connected to the input of said sense amplifier, by charging said first node to the power supply potential; and a test terminal and a control circuit that prohibits said bit line selection circuit from selecting a bit line when a test signal is inputted into said test terminal.

5. A semiconductor device, comprising:

a plurality of bit lines;

a plurality of word lines, each of which is placed so as to cross said bit lines;

a plurality of memory cell transistors, each of which is placed at an intersection between said plurality of bit lines and said plurality of word lines and has a gate connected to a word line of the plurality of word lines, and each of which stores different data by making its drain connected or non-connected to a bit line of the plurality of bit lines;

a word line selection circuit that selects a word line from among said plurality of word lines;

a bit line selection circuit that selects a bit line from among said plurality of bit lines;

a sense amplifier that determines the level of a bit line that has been selected via said bit line selection circuit in order to read out data of a memory cell transistor that corresponds to a word line that has been selected by said word line selection circuit and said bit line that has been selected by said bit line selection circuit;

a data holding circuit having two output terminals for positive logic and negative logic, into which an output from said sense amplifier is inputted;

an output circuit of which an input terminal is connected to either one of the two output terminals of said data holding circuit;

a charge circuit that charges a bit line that has been selected by said bit line selection circuit to the power supply potential via said bit line selection circuit from a first node, which is connected to the input of said sense amplifier, by charging said first node to the power supply potential; and a test terminal and a control circuit that prohibits said word line selection circuit from selecting a word line when a test signal is inputted into said test terminal.

6. A semiconductor device, comprising:

a memory part having a plurality of bit lines;

a plurality of word lines, each of which is placed so as to cross said bit lines;

a plurality of memory cell transistors, each of which is placed at an intersection between said plurality of bit lines and said plurality of word lines and has a gate connected to a word line, and each of which stores different data by making its drain connected or non-connected to a bit line;

a word line selection circuit that selects a word line from among said plurality of word lines;

a bit line selection circuit that selects a bit line from among said plurality of bit lines;

a sense amplifier that determines the level of a bit line that has been selected via said bit line selection circuit in order to read out data of a memory cell transistor that corresponds to a word line that has been selected by said word line selection circuit and said bit line that has been selected by said bit line selection circuit;

a data holding circuit into which an output from said sense amplifier is inputted;

an output circuit into which an output of said data holding circuit is inputted;

a buffer circuit having two output terminals for positive logic and negative logic into which an output of said output circuit of said memory part is inputted; and a data processing circuit of which an input terminal is connected to either one of the two output terminals of said buffer circuit.

7. The semiconductor device according to claim 6, wherein:

the connection/non-connection between the drains of memory cell transistors and bit lines is made through the formation/non-formation of first contact portions for making electrical connections between the drains of memory cell transistors and bit lines, the connection between one of the output terminals of said buffer circuit and the input terminal of said data processing circuit is made through the formation of a second contact portion for making an electrical connection between one of the output terminals of said buffer circuit and the input terminal of said data processing circuit, and said first contact portions and said second contact portion are formed in a same process step.

8. A semiconductor device, comprising:

a memory part having a plurality of bit lines;

a plurality of word lines, each of which is placed so as to cross said bit lines;

a plurality of memory cell transistors, each of which is placed at an intersection between said plurality of bit lines and said plurality of word lines and has a gate connected to a word line, and each of which stores different data by making its drain connected or non-connected to a bit line;

a word line selection circuit that selects a word line from among said plurality of word lines;

a bit line selection circuit that selects a bit line from among said plurality of bit lines;

a sense amplifier that determines the level of a bit line that has been selected via said bit line selection circuit in order to read out data of a memory cell transistor that corresponds to a word line that has been selected by said word line selection circuit and said bit line that has been selected by said bit line selection circuit;

a data holding circuit into which an output from said sense amplifier is inputted;

an output circuit into which an output of said data holding circuit is inputted; and a data processing part formed of an input circuit having two output terminals for positive logic and negative logic into which an output of said output circuit of said memory part is inputted, and a data processing circuit of which an input terminal is connected to either one of the two output terminals of said input circuit.

9. The semiconductor device according to claim 8, wherein:

the connection/non-connection between the drains of memory cell transistors and bit lines is made through the formation/non-formation of first contact portions for making electrical connections between the drains of memory cell transistors and bit lines, the connection between one of the output terminals of said input circuit of said data processing part and the input terminal of said data processing circuit is made through the formation of a second contact portion for making an electrical connection between one of the output terminals of said input circuit and the input terminal of said data processing circuit, and said first contact portions and said second contact portion are formed in a same process step.

* * * * *